United States Patent
Li

(10) Patent No.: US 8,142,056 B2
(45) Date of Patent: Mar. 27, 2012

(54) HIGH EFFICIENCY REFRACTION BODY

(76) Inventor: Chia-Mao Li, Taipei (TW)

( * ) Notice: Subject to any disclaimer, the term of this patent is extended or adjusted under 35 U.S.C. 154(b) by 0 days.

(21) Appl. No.: 12/837,510

(22) Filed: Jul. 16, 2010

(65) Prior Publication Data

US 2012/0014112 A1 Jan. 19, 2012

(51) Int. Cl.
*F21V 5/00* (2006.01)

(52) U.S. Cl. .............. 362/326; 362/311.02; 362/311.06; 362/308

(58) Field of Classification Search .................. 362/307, 362/308, 310, 327, 328, 326, 311.02, 311.06
See application file for complete search history.

(56) References Cited

U.S. PATENT DOCUMENTS

| | | | | |
|---|---|---|---|---|
| 5,335,157 A * | 8/1994 | Lyons | ........................... | 362/297 |
| 6,598,998 B2 * | 7/2003 | West et al. | ..................... | 362/307 |
| 7,438,445 B2 * | 10/2008 | Shiau et al. | .................... | 362/333 |
| 7,738,189 B2 * | 6/2010 | Park et al. | ..................... | 359/727 |
| 7,748,873 B2 * | 7/2010 | Kim et al. | ..................... | 362/328 |
| 7,901,113 B2 * | 3/2011 | Kim et al. | ..................... | 362/328 |

* cited by examiner

*Primary Examiner* — Ali Alavi

(74) *Attorney, Agent, or Firm* — Leong C. Lei

(57) ABSTRACT

A high efficiency refraction body includes a light source chamber and a main refraction surface opposite to the light source chamber. A first refraction surface and a second refraction surface for refracting the lights are formed to a peripheral of the high efficiency refraction body. A light source is received to the light source chamber. Lights from the light source will be total reflected because the incident angles of the lights exceed a critical angle of the main refraction surface. The reflected lights will be refracted through the first refraction surface and the second refraction surface so as to pass a lateral of the refraction body. A uniform lateral illumination of the refraction body will correct the poor lateral illumination of LED light devices.

2 Claims, 8 Drawing Sheets

HIGH EFFICIENCY REFRACTION BODY

FIELD OF THE INVENTION

The present invention relates to refraction body, and particular to a high efficiency refraction body capable of total reflecting and substantially refracting lights from its light source.

DESCRIPTION OF THE PRIOR ART

Prior LED lamp devices include a metal cup body and a guiding component. The guiding component has a curved surface on an inner surface of an upper end thereof and an inclined surface on a peripheral of a lower end thereof. Such devices can be applied to alarm lamp, alarm lamp on police patrol car, alarm lamp for tall building, or guiding signal for airport runway. Refraction bodies of such devices are located to the focus points of the curved surfaces of the metal reflection cup body. The dizzy light of the LED will be eliminated through the assembly. However, the refraction angle of such design is not wide enough to have a refraction larger than 180 degrees.

SUMMARY OF THE PRESENT INVENTION

Accordingly, the primary object of the present invention is to provide a high efficiency refraction body capable of total reflecting and substantially refracting lights from its light source so as to have a wider illumination.

Another object of the present invention is to provide a high efficiency refraction body having a good lateral illumination for various applications of illumination.

Through the high efficiency refraction body, lights from its light source will be total reflected and substantially refracted by the surfaces. While a LED light source is arranged to the high efficiency refraction body, lights from the LED light source will be total reflected through a main refraction surface and refracted through a first refraction surface and a second refraction surface so as to be projected through a lateral of the high efficiency refraction body uniformly. An illumination area is increased and a visibility is also improved. Comparing to straight projection of a prior LED lamp device, the present invention can provide more lateral illumination so that the present invention can be applied to various devices such as desk lamp, floor lamp, chandelier, plywood lamp, decorative lamp, or other light sources.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
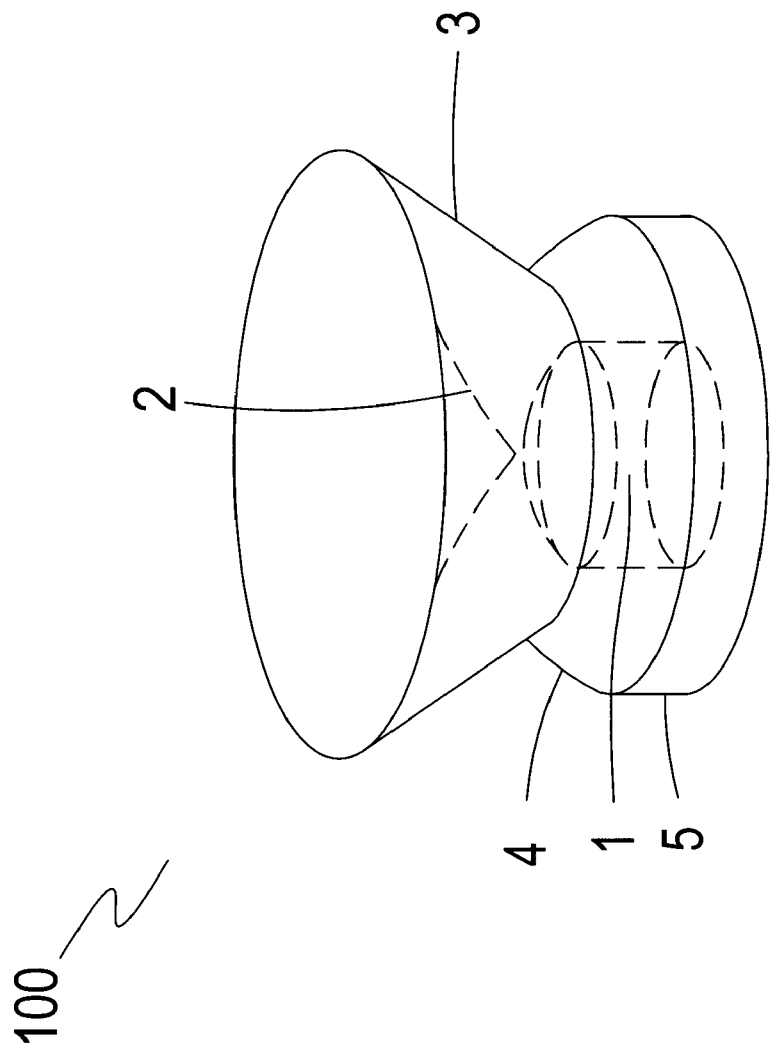
FIG. 1 is a schematic view of the present invention.
Figure 2:
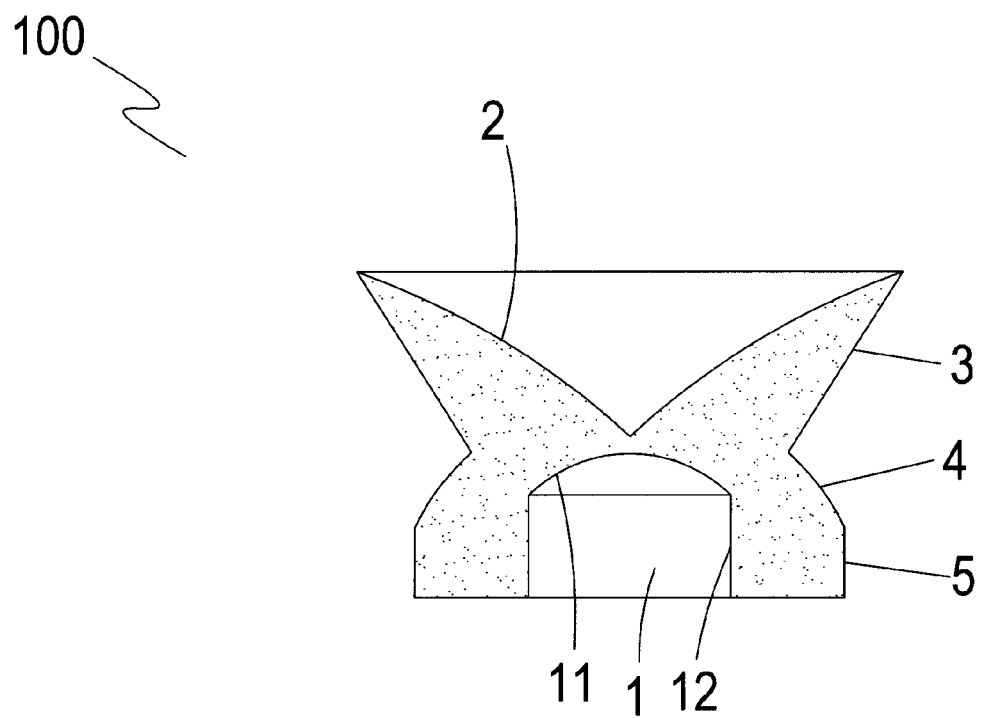
FIG. 2 is a cross-section view of the present invention.

Referring to FIGS. 1 and 2, a high efficiency refraction body 100 according to present invention has a light source chamber 1 and a main refraction surface 2. The light source chamber 1 for receiving a light source has a transmission surface 11 on a top of the light source chamber 1 and an inner wall 12 around the light source chamber 1. The transmission surface 11 is pervious to light. The main refraction surface 2 is formed above the light source chamber 1 and the cross section of the main refraction surface is approximately a shape of a V. Light from the light source chamber 1 will be total reflected to a lateral of the high efficiency refraction body 100 because of the incident angles of the lights exceed a critical angle.

The lateral of the high efficiency refraction body 100 further has a first refraction surface 3, second refraction surface 4, and a third refraction surface 5. The first refraction surface 3 is opposite to the main refraction surface 2. A predetermined angle θ1 is between the main refraction surface 2 and the first refraction surface 3. Lights from the light source chamber 1 being total reflected through the main refraction surface 2 will be refracted out of the high efficiency refraction body 100 through the first refraction surface 3. The second refraction surface 4 is adjacent to the first refraction surface 3. There is a predetermined angle θ2 between the first refraction surface 3 and the second refraction surface 4. Lights from the light source chamber 1 will be refracted out of the high efficiency refraction body 100 through the second refraction surface 4. The third refraction surface 5 is adjacent to the second refraction surface 4. There is a predetermined angle θ3 between the second refraction surface 4 and the third refraction surface 5, ant the third refraction surface 5 is parallel to the inner wall 12 of the light source chamber 1. Lights from the light source chamber 1 will be refracted out of the high efficiency refraction body 100 through the third refraction surface 5.

Figure 3:
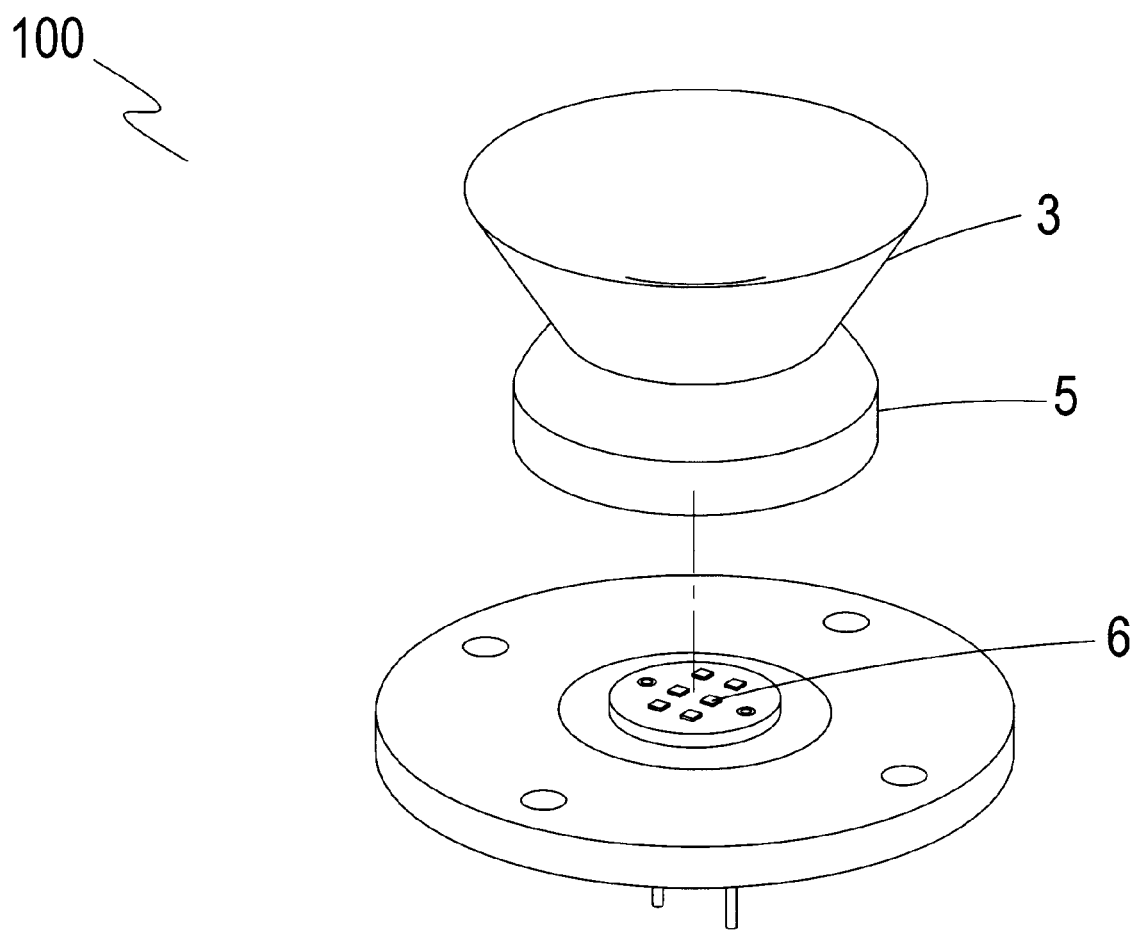
FIG. 3 is a schematic view showing a light source separated from the present invention.
Figure 4:
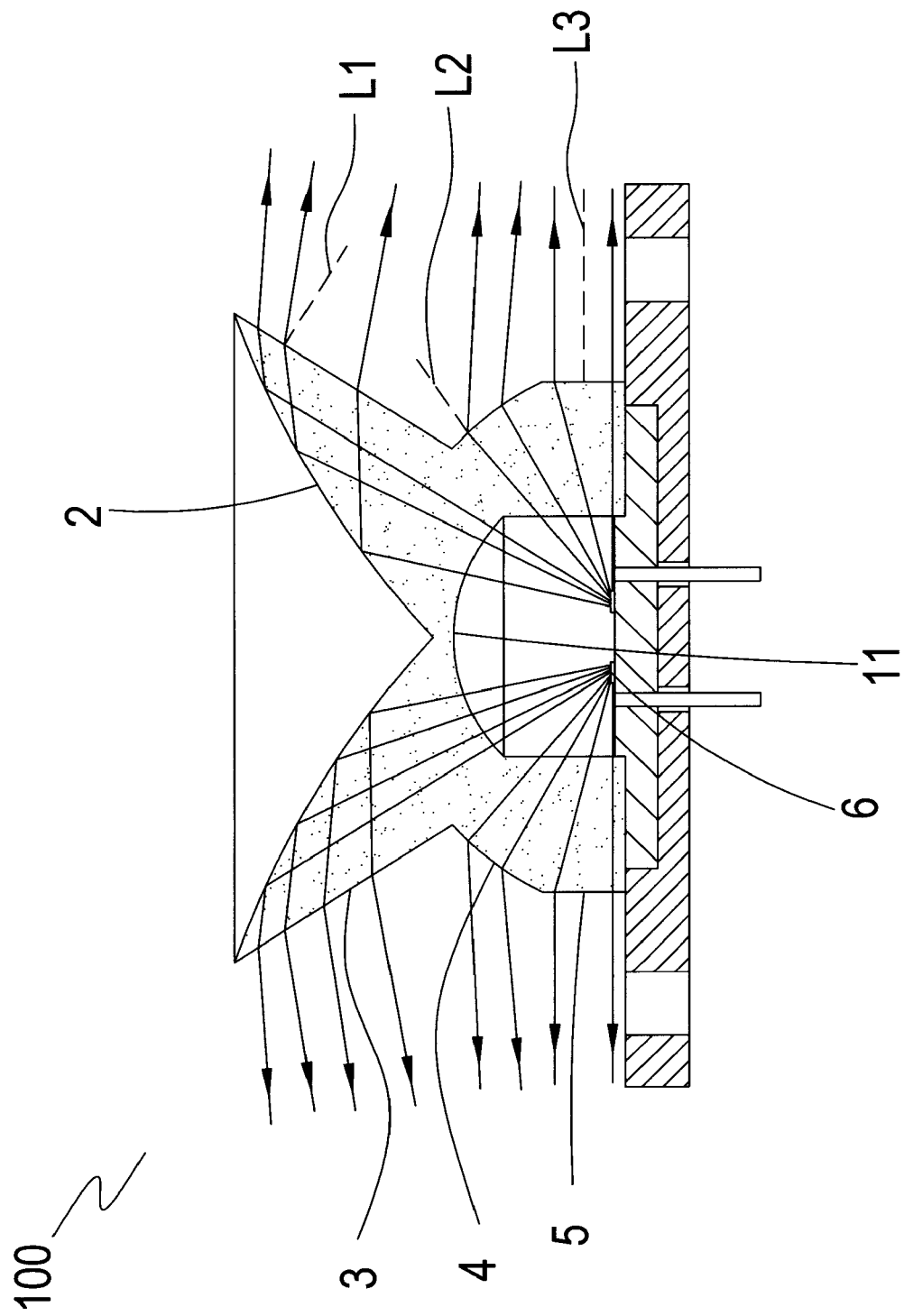
FIG. 4 is a schematic view showing a first embodiment of the present invention.

Referring to FIGS. 3 and 4, the high efficiency refraction body 100 is arranged to a LED light source 6. The light source of the LED light source 6 is received to the light source chamber 1 of the high efficiency refraction body 100 so that the lights from the LED light source 6 will be projected through the lateral of the high efficiency refraction body 100.

Lights from the LED light source 6 received to the light source chamber 1 will pass through the transmission surface 11 to the main refraction surface 2. The main refraction surface 2 is also curved so that the lights will be total reflected to the first refraction surface 3 because of the critical angle larger than 90 degrees.

Lights will be refracted through the first refraction surface 3 because of the difference of the refractive indexes of different mediums. Therefore, Lights passing through the first refraction surface 3 will away from a normal L1 of the first refraction surface 3.

Lights from the LED light source 6 will also pass through the inner wall 12 of the high efficiency refraction body 100 to the second refraction surface 4. Lights passing through the second refraction surface 4 will away from a normal L2 of the first refraction surface 3 because of the difference of the refractive indexes of different mediums.

Lights from the LED light source 6 will also pass through the inner wall 12 of the high efficiency refraction body 100 to the third refraction surface 5. However, the Lights are almost perpendicular to the third refraction surface 5 so that the refractive angle is approximately zero. That means the lights will be parallel to a normal of the third refraction surface 5.

While the LED light source 6 is received to the light source chamber 1, lights from the LED light source 6 will be total reflected through the main refraction surface 2 and refracted through the first refraction surface 3 and the second refraction surface 4 so as to be projected through the lateral of the high efficiency refraction body 100 uniformly. An illumination area is increased and a visibility is also improved so that the present invention can be applied to various devices such as desk lamp, floor lamp, chandelier, plywood lamp, decorative lamp, or other light sources.

Figure 5:
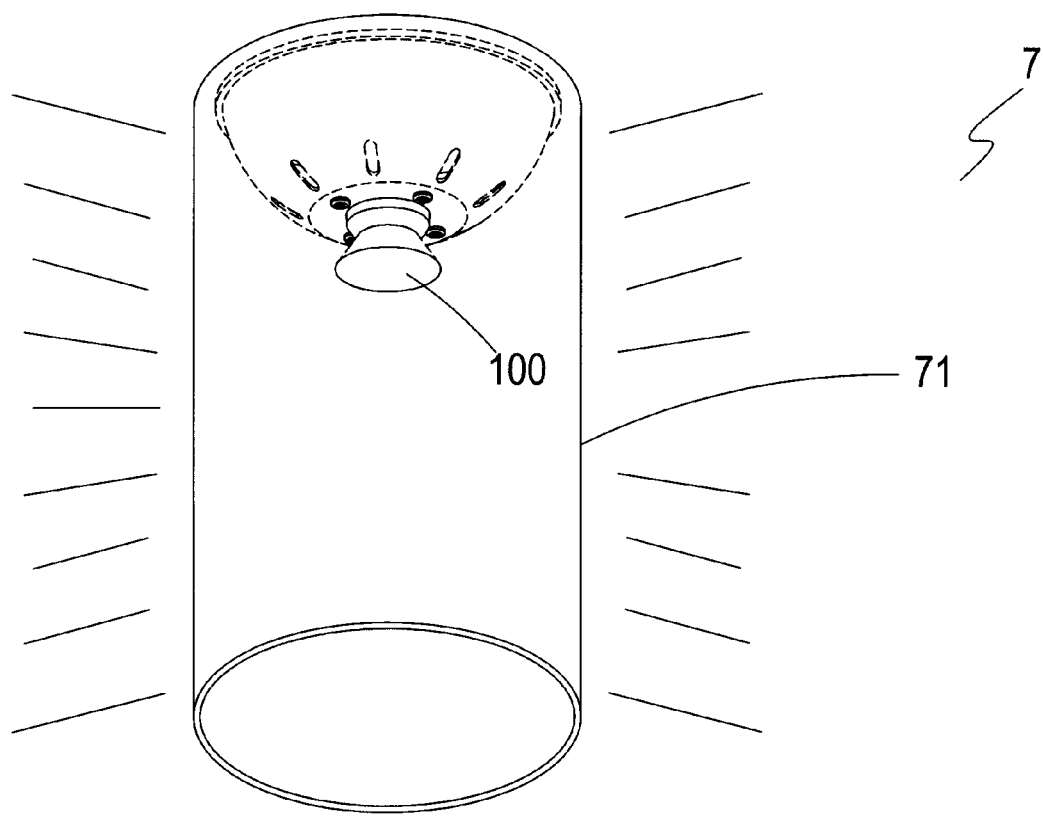
FIG. 5 is a schematic view showing the present invention applied to a decorative lamp.

Referring to FIG. 5, the present invention is applied to a decorative lamp 7. Lights from a LED light source will be projected out from the lateral of the high efficiency refraction body 100 so as to pass through a lamp case 71 of the decorative lamp 7. Comparing to straight projection of a prior LED lamp device, the present invention can provide more lateral illumination so that the decorative lamp 7 will become brighter and more atmospheric.

Figure 6:
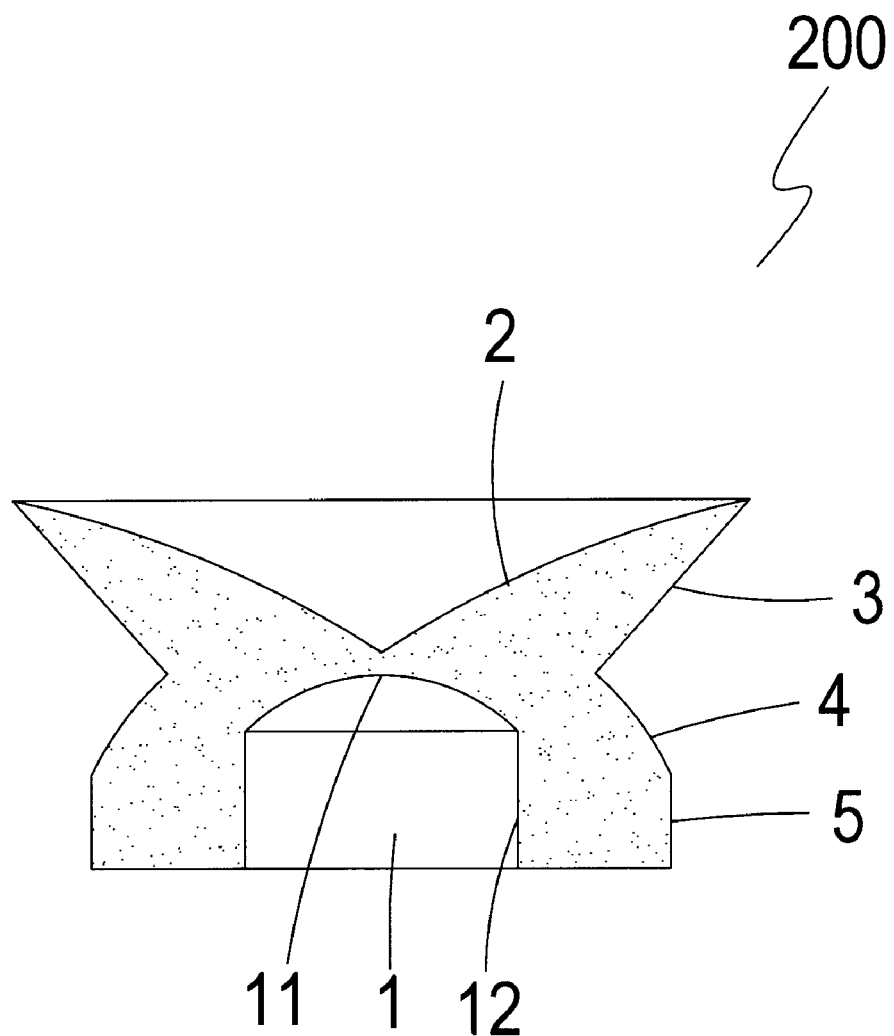
FIG. 6 is a schematic view showing a second embodiment of the present invention.

Referring to FIG. 6, the second embodiment of the present invention is illustrated. The components and the operation is pretty much the same as the first embodiment. An inclination of the main refraction surface 2 is different from the first embodiment of the present invention. Therefore, a different θ1 between the main refraction surface 2 and the first refraction surface 3 will improve a total reflection so that more lights can be reflected to the first refraction surface 3.

Figure 7:
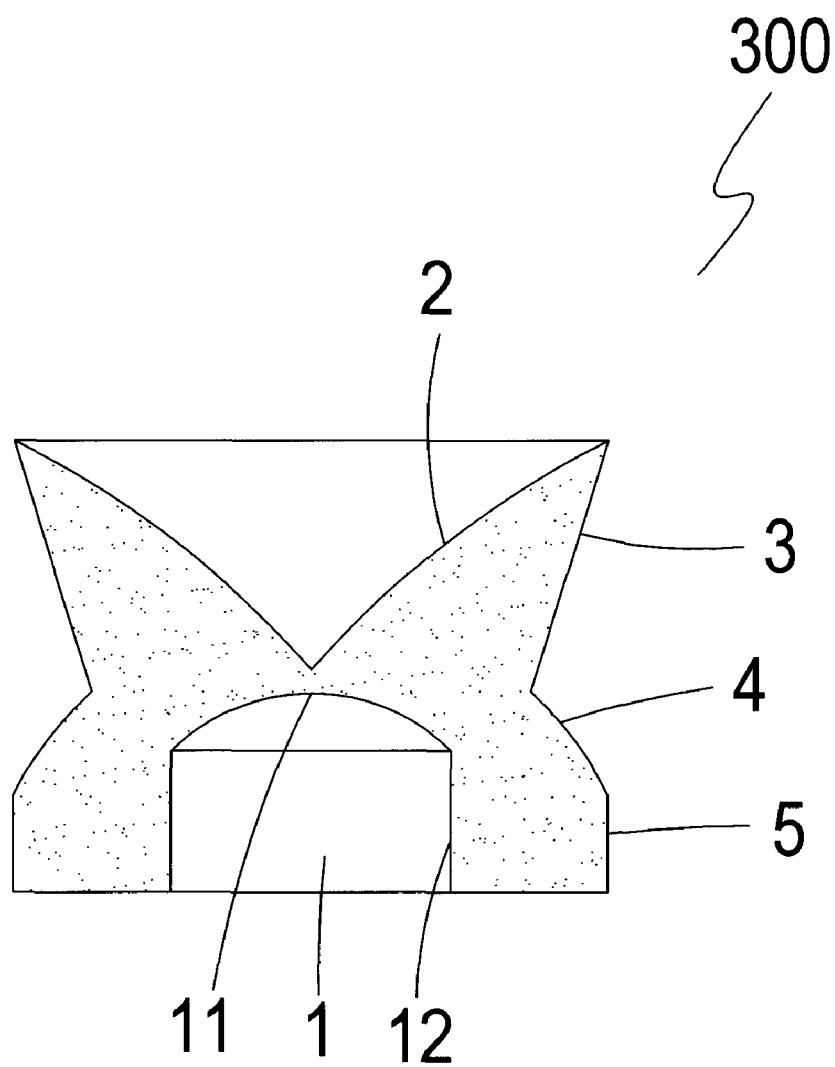
FIG. 7 is a schematic view showing a third embodiment of the present invention.

Referring to FIG. 7, a third embodiment of the present invention is illustrated. The components and the operation is pretty much the same as the first embodiment. An inclination of a first refraction surface 3 is changed from the first embodiment. Angles θ1 between a main refraction surface 2 and the first refraction surface 3, θ2 between the first refraction surface 3 and a second refraction surface 4 are also changed. Lights being reflected through the main refraction surface 2 to the first refraction surface 3 can be widely refracted out of the high efficiency refraction body 100.

Figure 8:
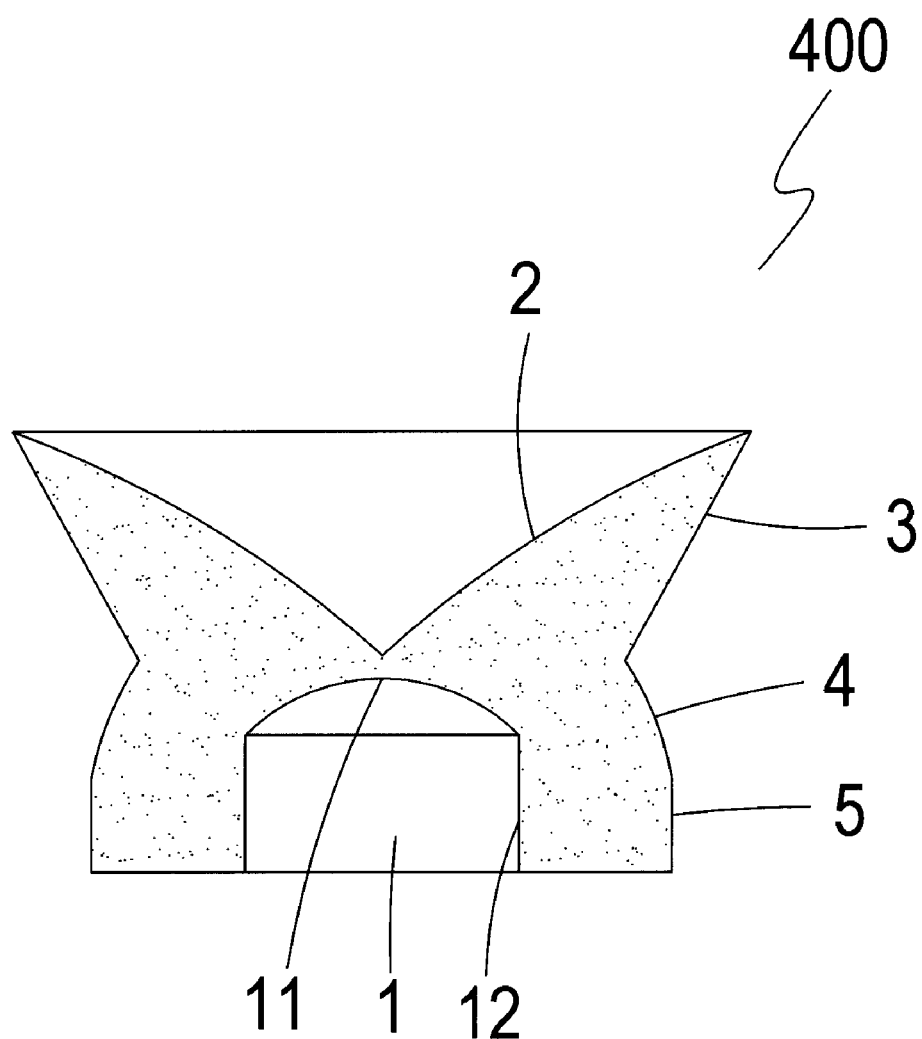
FIG. 8 is a schematic view showing a fourth embodiment of the present invention.

Referring to FIG. 8, a fourth embodiment of the present invention is illustrated. The components and the operation is pretty much the same as the first embodiment. An inclination of the second refraction surface 4 is changed. Angle θ2 between a first refraction surface 3 and a second refraction surface 4 is also changed. Lights passing through an inner wall 12 to the second refraction surface 4 can be widely refracted out of the high efficiency refraction body 100.

Through above descriptions, the present invention applied to a lamp device is capable of refracting the lights from a light source to a lateral so as to improve a lateral illumination. The present invention can be applied to the LED lamp devices to correct the defect of poor lateral illumination of the LED lamp devices so that the LED devices can be applied to various lamp devices such as desk lamp, floor lamp, chandelier, plywood lamp, decorations, or other light sources.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A high efficiency refraction body comprising:
   a light source chamber having an inner top formed with a transmission surface and an inner wall around said light source chamber;
   a main refraction surface formed above said light source chamber and having a V-shaped cross-section;
   a first refraction surface opposite to said main refraction surface and having a first angle with said main refraction surface thereby causing light from said light source chamber being totally reflected through said main refraction surface to be refracted out said high efficiency refraction body through said first refraction surface;
   a second refraction surface which is curved outwardly and adjacent to said first refraction surface and having a second angle with said first refraction surface thereby causing light from said light source chamber to be refracted out of said high efficiency refraction body through said second refraction surface; and
   a third refraction surface adjacent to said second refraction surface and having a third angle with said second refraction surface, said third refraction surface being parallel to said inner wall of said light source chamber thereby causing light from said light source chamber to be refracted out said high efficiency refraction body through said third refraction surface.

2. The high efficiency refraction body as claimed in claim 1, wherein said main refraction surface is curved.

* * * * *